(12) United States Patent
Sasaki et al.

(10) Patent No.: US 11,692,623 B2
(45) Date of Patent: Jul. 4, 2023

(54) ACTUATOR UNIT

(71) Applicants: TOYOTA JIDOSHA KABUSHIKI KAISHA, Toyota (JP); AISIN CORPORATION, Kariya (JP)

(72) Inventors: Masashi Sasaki, Seto (JP); Atsushi Kamada, Miyoshi (JP); Kota Fujii, Nisshin (JP); Daisuke Kikukawa, Nagoya (JP); Shinya Kuwahara, Kariya (JP); Keiji Suzumura, Kariya (JP)

(73) Assignees: TOYOTA JIDOSHA KABUSHIKI KAISHA, Toyota (JP); AISIN CORPORATION, Kariya (JP)

( * ) Notice: Subject to any disclaimer, the term of this patent is extended or adjusted under 35 U.S.C. 154(b) by 0 days.

(21) Appl. No.: 17/583,871

(22) Filed: Jan. 25, 2022

(65) Prior Publication Data

US 2022/0307593 A1 Sep. 29, 2022

(30) Foreign Application Priority Data

Mar. 23, 2021 (JP) ................................. 2021-049002

(51) Int. Cl.
*F16H 61/32* (2006.01)
*F16H 61/00* (2006.01)
(Continued)

(52) U.S. Cl.
CPC .......... *F16H 61/32* (2013.01); *F16H 61/0006* (2013.01); *H05K 5/0082* (2013.01); *H05K 5/03* (2013.01); *F16H 2061/326* (2013.01)

(58) Field of Classification Search
CPC .......... F16H 2061/326; F16H 61/0006; F16H 61/32; H05K 5/0082; H05K 5/03
See application file for complete search history.

(56) References Cited

U.S. PATENT DOCUMENTS 4,313,025 A * 1/1982 Grube, Jr. ................ H05K 5/03
220/555
4,327,257 A * 4/1982 Schwartz ............... H04R 9/045
181/171

(Continued)

FOREIGN PATENT DOCUMENTS

JP 2016075364 A 5/2016

*Primary Examiner* — David M Fenstermacher
(74) *Attorney, Agent, or Firm* — Hunton Andrews Kurth LLP

(57) ABSTRACT

An actuator unit that drives a switching mechanism for a shift range of an automatic transmission is provided. The actuator unit includes a motor that generates a drive force for driving the switching mechanism, a control substrate that controls the motor, a connector that connects a wire to the control substrate, a housing that includes an opening, a cover that covers the opening, and a shock absorption material that includes a first shock absorption material and a second shock absorption material. The motor and the control substrate are positioned in a housing space defined by the housing and the cover. The control substrate is fixed to the housing. The first shock absorption material and the second shock absorption material are positioned between the control substrate and the cover, and contacts both the control substrate and the cover.

7 Claims, 5 Drawing Sheets

(51) Int. Cl.
    *H05K 5/00*        (2006.01)
    *H05K 5/03*        (2006.01)

(56) References Cited

U.S. PATENT DOCUMENTS

| | | | | |
|---|---|---|---|---|
| 4,396,011 | A * | 8/1983 | Mack | A61H 23/02 |
| | | | | 601/18 |
| 4,553,183 | A * | 11/1985 | Brown | G11B 23/507 |
| | | | | 360/99.08 |
| 4,884,169 | A * | 11/1989 | Cutchaw | H01L 23/427 |
| | | | | 257/713 |
| 4,997,342 | A * | 3/1991 | Conger, IV | F04D 29/668 |
| | | | | 415/214.1 |
| 5,282,101 | A * | 1/1994 | Reinisch | G11B 25/043 |
| | | | | 360/99.19 |
| 6,529,345 | B1 * | 3/2003 | Butler | G11B 33/08 |
| | | | | 360/99.18 |
| 6,954,329 | B1 * | 10/2005 | Ojeda | G11B 25/043 |
| | | | | 720/651 |
| 9,508,393 | B1 * | 11/2016 | Le | G11B 33/148 |
| 2002/0057522 | A1 * | 5/2002 | Bernett | G11B 33/121 |
| 2005/0094311 | A1 * | 5/2005 | Boss | G11B 33/08 |
| 2011/0279961 | A1 * | 11/2011 | Shedletsky | G06F 3/0412 |
| | | | | 361/679.01 |
| 2016/0102761 | A1 * | 4/2016 | Kuwahara | F16H 61/24 |
| | | | | 74/473.12 |
| 2018/0003503 | A1 * | 1/2018 | Haubold | G01P 15/125 |
| 2019/0241428 | A1 * | 8/2019 | Mitchell | B81B 7/0048 |
| 2022/0016451 | A1 * | 1/2022 | Hall | A62B 18/045 |

* cited by examiner

ACTUATOR UNIT

CROSS-REFERENCE TO RELATED APPLICATION

This application claims priority to Japanese Patent Application No. 2021-049002 filed on Mar. 23, 2021, incorporated herein by reference in its entirety.

BACKGROUND

1. Technical Field

The present disclosure relates to an actuator unit.

2. Description of Related Art

A vehicle disclosed in Japanese Unexamined Patent Application Publication No. 2016-075364 (JP 2016-075364 A) includes a shift device of a so-called shift-by-wire type. The shift device includes a switching mechanism that switches a shift range of an automatic transmission and an actuator unit that drives the switching mechanism. The actuator unit includes a housing, a cover, a motor, a speed reduction mechanism, and a control substrate. The housing is of a box type. The cover covers an opening of the housing. The motor, the speed reduction mechanism, and the control substrate are positioned in a space defined by the housing and the cover. The motor is connected to the switching mechanism via an output shaft of the speed reduction mechanism. The speed reduction mechanism is a gear mechanism that includes a plurality of gears. A control device acquires a signal according to an operation of a shift lever by a user. The control device drives the motor based on the acquired signal. The switching mechanism operates when rotation of the motor is transferred to the switching mechanism. As a result, the shift range of the automatic transmission is switched.

SUMMARY

When the shift range is switched in the technique according to JP 2016-075364 A, a rotor shaft of the motor occasionally vibrates because of backlash of gears in the speed reduction mechanism. The vibration is occasionally transmitted to the cover via the housing. The cover is resonated when the frequency of the vibration coincides with the natural frequency of the cover. In this case, vibration of the cover can cause noise, which is not preferable. Besides the backlash of the gears in the speed reduction mechanism, a similar issue is caused when the frequency of any vibration in the vehicle and the natural frequency of the cover coincide with each other.

The present disclosure provides an actuator unit that can suppress volume of noise caused along with vibration of a cover provided inside the actuator unit when a shift range of an automatic transmission is switched.

An aspect of the present disclosure relates to an actuator unit that includes a motor, a control substrate, a connector, a housing, a cover, and a shock absorption material, the actuator unit being coupled to a switching mechanism that switches a shift range of an automatic transmission and configured to drive the switching mechanism. The motor is configured to generate a drive force for driving the switching mechanism. The control substrate is configured to control the motor. The connector is configured to connect a wire to the control substrate. The housing includes an opening. The cover is configured to cover the opening. The motor and the control substrate are positioned in a housing space defined by the housing and the cover. The control substrate is fixed to the housing. The shock absorption material is positioned between the control substrate and the cover, and contacts both the control substrate and the cover.

In the actuator unit according to the aspect described above, the cover is not easily vibrated at a location at which the shock absorption material is present when the cover is resonated. That is, a location that would serve as an antinode of vibration of the cover if there were no shock absorption material serves as a node of vibration because of the presence of the shock absorption material. In this case, an additional node is generated between nodes of vibration of the cover. Thus, the distance between the nodes becomes shorter. Therefore, the amplitude of an antinode of vibration of the cover becomes lower. Thus, the volume of noise caused along with vibration of the cover can be suppressed.

In the actuator unit according to the aspect described above, the control substrate may include a first fixing portion fixed to the housing, a second fixing portion fixed to the motor, and a third fixing portion fixed to the connector. The control substrate may be in a flat plate shape. The shock absorption material may be positioned at a position overlapping at least one of the first fixing portion, the second fixing portion, and the third fixing portion as viewed in plan in a direction that is orthogonal to a main surface of the control substrate.

Vibration from the housing is occasionally transmitted to the control substrate. In this case, the control substrate may be vibrated. The first fixing portion, the second fixing portion, and the third fixing portion that are portions of the control substrate and are fixed to other components, are not easily vibrated when the control substrate is vibrated. That is, such locations serve as nodes of vibration of the control substrate. In the actuator unit configured as described above, the shock absorption material is disposed at a location that serves as a node of vibration of the control substrate. Consequently, transmission of vibration of the control substrate to the cover via the shock absorption material can be suppressed.

In the actuator unit according to the aspect described above, a protrusion that projects from the control substrate toward the shock absorption material may be provided between the control substrate and the cover. The shock absorption material may include a hole dented inward of the shock absorption material from an outer face that faces the control substrate. At least a part of the protrusion may be positioned inside the hole. With the actuator unit configured in this manner, the shock absorption material can be positioned with respect to the control substrate by utilizing a relationship between the protrusion and the hole of a structure in which the protrusion is inserted into the hole.

In the actuator unit according to the aspect described above, when a wall of the cover, the wall contacting the shock absorption material, is defined as a first wall, the first wall may be in a flat plate shape. The shock absorption material may be positioned at a position overlapping a geometric center of the first wall as viewed in plan in a direction that is orthogonal to a main surface of the first wall.

It is highly possible that the geometric center of the first wall serves as an antinode of vibration of the first wall if there were no shock absorption material. Thus, in the actuator unit configured as described above, the shock absorption material is disposed at a location that tends to serve as an antinode of vibration of the first wall. Consequently, vibration of the first wall can be suppressed effectively.

In the actuator unit according to the aspect described above, a plurality of the shock absorption materials may be provided between the control substrate and the cover. The control substrate may be in a flat plate shape. The shock absorption materials may be positioned at positions not overlapping each other as viewed in plan in a direction that is orthogonal to a main surface of the control substrate. With the actuator unit configured in this manner, the number of nodes of vibration of the cover can be increased in accordance with the number of shock absorption materials. Therefore, vibration of the cover can be suppressed effectively.

In the actuator unit according to the aspect described above, a material of the shock absorption material may be gel. With the actuator unit configured as described above, it is possible to mitigate input of a stress from the cover to the control substrate caused along with vibration of the cover.

In the actuator unit according to the aspect described above, the material of the shock absorption material may be the gel and a material that is usable to generate a node of vibration in an end wall of the cover. With the actuator unit configured as described above, nodes of vibration can be generated in the end wall of the cover because of the material of the shock absorption material, and thus vibration of the cover can be suppressed efficiently.

In the actuator unit according to the aspect described above, the cover may be a magnetic body. With the actuator unit configured as described above, the cover is a magnetic body with insulation properties, and thus the insulation between the control substrate and the cover can be secured.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
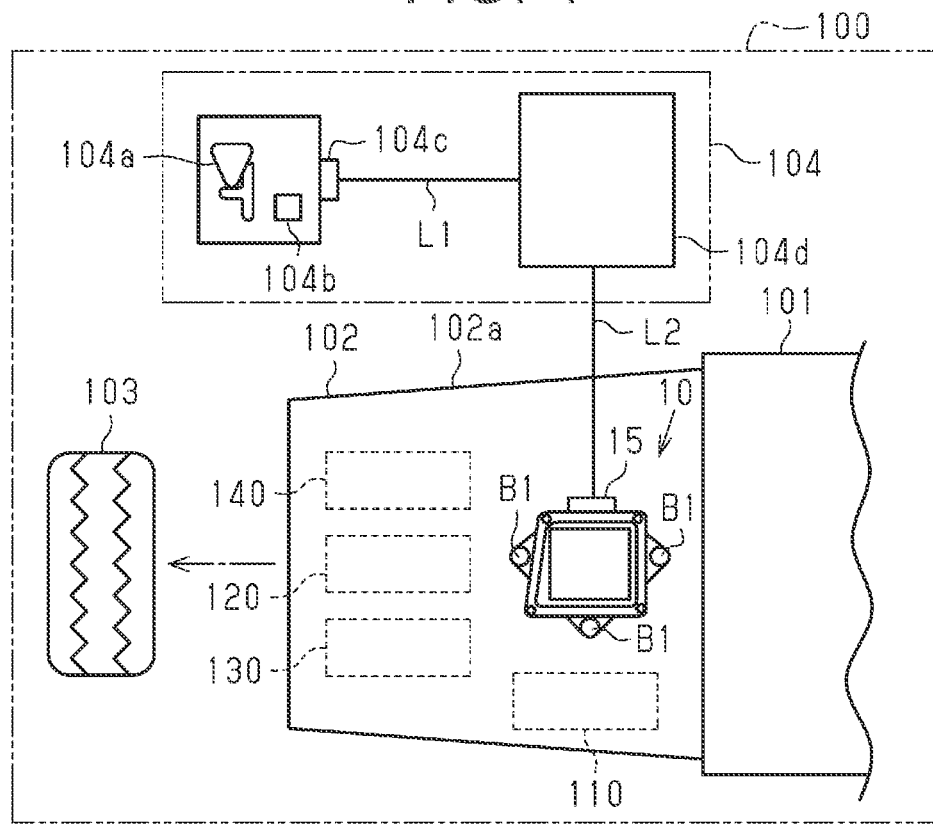
FIG. 1 is a schematic diagram of a vehicle.

An actuator unit according to an embodiment of the present disclosure will be described below with reference to the drawings. First, a schematic configuration of a vehicle will be described. As illustrated in FIG. 1, a vehicle 100 includes an internal combustion engine 101, an automatic transmission 102, and drive wheels 103. The internal combustion engine 101 is a drive source for the vehicle 100. The automatic transmission 102 is a multi-speed transmission. An input shaft of the automatic transmission 102 is connected to an output shaft of the internal combustion engine 101. An output shaft of the automatic transmission 102 is connected to the drive wheels 103 via a differential. The differential allows a difference in a rotational speed between the right and left drive wheels 103. The differential is not illustrated in FIG. 1.

The vehicle 100 includes a select device 104. The select device 104 is a device that allows a driver of the vehicle 100 to select one of four shift ranges of the automatic transmission 102. The select device 104 includes a shift lever 104a, a parking switch 104b, a shift position sensor 104c, and a shift electronic control unit (ECU) 104d. The shift lever 104a is a lever that is used to select one of a neutral range (hereinafter referred to as an N range), a drive range (hereinafter referred to as a D range), and a reverse range (hereinafter referred to as an R range). The shift lever 104a is switchable to operation positions corresponding to the three shift ranges. The parking switch 104b is a switch that is used to select a parking range (hereinafter referred to as a P range). The shift position sensor 104c detects the operation position of the shift lever 104a and whether the parking switch 104b is on or off. The shift ranges will be discussed in detail later.

The shift ECU 104d is an electronic control device. That is, the shift ECU 104d may be constituted as one or more processors that execute various processes in accordance with a computer program (software). The shift ECU 104d may be constituted as one or more dedicated hardware circuits such as application specific integrated circuits (ASICs) that execute at least a part of the various processes, or circuitry that includes a combination of such hardware circuits. The processor includes a central processing unit (CPU) and memories such as a random-access memory (RAM) and a read-only memory (ROM). The memories store program codes or instructions configured to cause the CPU to execute the processes. The memories, that is, computer readable media, include any available medium that is accessible by a general-purpose or dedicated computer.

The shift ECU 104d is connected to the shift position sensor 104c via a wire L1. The shift ECU 104d acquires information on the operation position of the shift lever 104a, which is detected by the shift position sensor 104c, and whether the parking switch 104b is on or off. The shift ECU 104d calculates a target shift range based on such information. The shift ECU 104d outputs the target shift range to the automatic transmission 102 via a wire L2.

Next, the configuration of the automatic transmission 102 will be discussed in detail. The automatic transmission 102 includes a case 102a, a speed change mechanism 120, a hydraulic circuit 130, and a parking lock mechanism 140.

The case 102a houses the speed change mechanism 120, the hydraulic circuit 130, and the parking lock mechanism 140. The speed change mechanism 120 includes a plurality of clutches and a plurality of brakes that serve as a plurality of engagement elements and a plurality of planetary gear mechanisms. The state of engagement and disengagement of the engagement elements is switched in accordance with a hydraulic pressure. The speed change mechanism 120 can establish a plurality of shift speeds in accordance with the state of engagement and disengagement of the engagement elements. Specifically, the speed change mechanism 120 can establish a shift speed for forward travel, a shift speed for reverse travel, and a shift speed for shutting off power transfer between the input shaft and the output shaft of the automatic transmission 102 (hereinafter referred to as a shift speed for shutting off power transfer). The speed change mechanism 120 can establish a plurality of shift speeds such as a "first speed" to a "fifth speed", for example, for the shift speed for forward travel.

Figure 3:
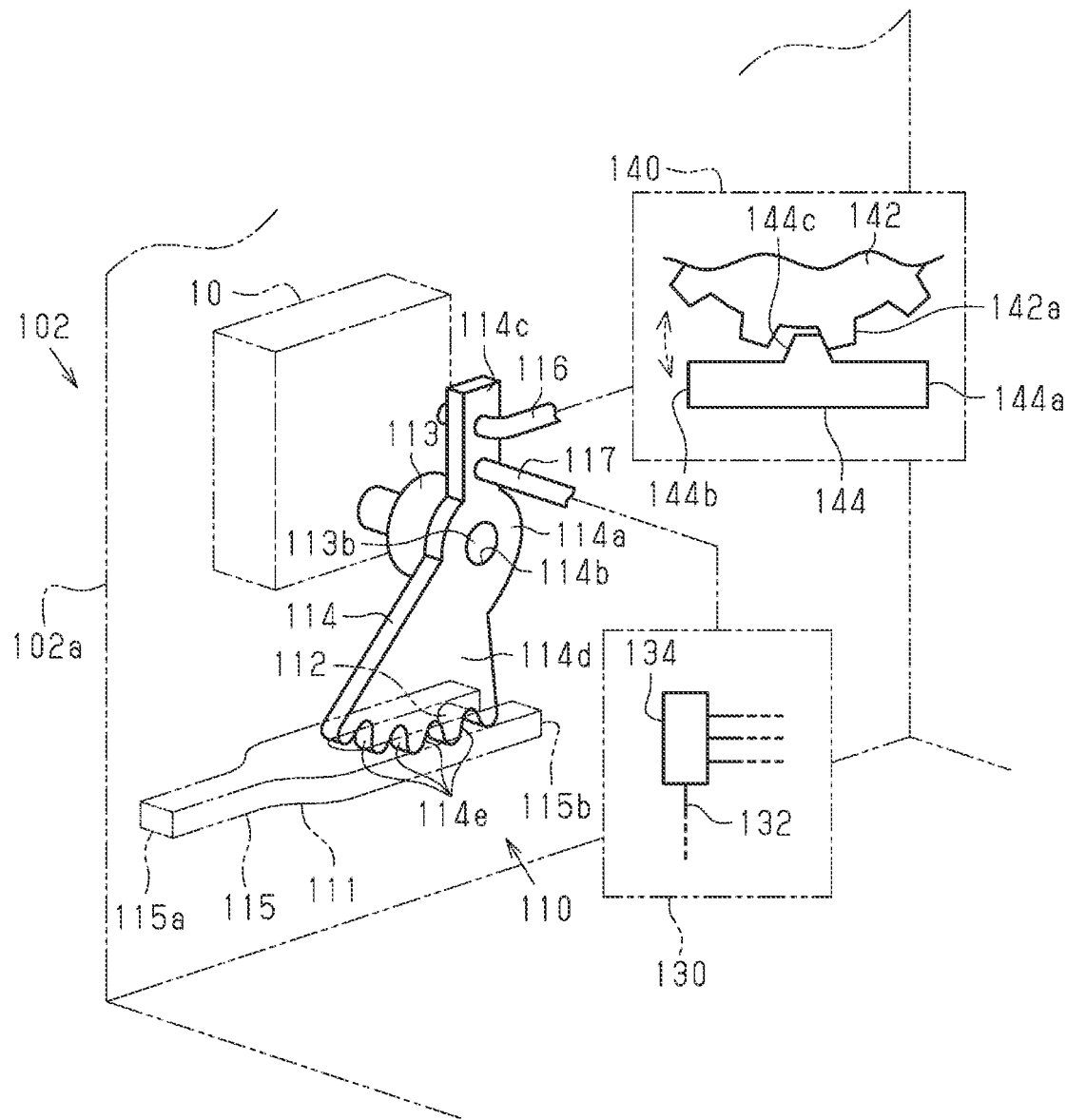
FIG. 3 is a schematic diagram of the automatic transmission that is mounted on the vehicle.

As illustrated in FIG. 3, the hydraulic circuit 130 includes an oil path 132 and a valve 134. The oil path 132 is a flow path through which working oil flows. The oil path 132 receives supply of working oil from a mechanical oil pump driven by the output shaft of the internal combustion engine 101, although not illustrated. The oil path 132 is connected to the engagement elements. The oil path 132 supplies working oil to the engagement elements. The valve 134 is positioned in the middle of the oil path 132. The valve 134 switches the path through which working oil flows. Accordingly, a hydraulic pressure to be supplied to each engagement element is switched. The shift speed established by the speed change mechanism 120 is switched as described above as the hydraulic pressure supplied to each engagement element is switched.

The parking lock mechanism 140 includes a parking lock gear 142 and a parking pawl 144. The parking lock gear 142 is an externally toothed gear. The parking lock gear 142 is rotated together with the output shaft of the automatic transmission 102. The parking pawl 144 has an elongated plate shape. The parking pawl 144 is positioned in the vicinity of the parking lock gear 142. The parking pawl 144 includes an engagement portion 144c between a first end portion 144a and a second end portion 144b. The engagement portion 144c projects toward the parking lock gear 142. The parking pawl 144 is rotatable in both forward and reverse directions about the first end portion 144a. The engagement portion 144c is moved closer to and away from the parking lock gear 142 along with rotational operation of the parking pawl 144. The parking lock gear 142 becomes non-rotatable when the engagement portion 144c is moved closer to the parking lock gear 142 and the engagement portion 144c is meshed with teeth 142a of the parking lock gear 142. That is, the output shaft of the automatic transmission 102 is in a locked state together with the parking lock gear 142. The parking lock gear 142 becomes rotatable when the engagement portion 144c is moved away from the parking lock gear 142 and the meshing of the engagement portion 144c with the teeth 142a of the parking lock gear 142 is canceled. That is, the output shaft of the automatic transmission 102 is in an unlocked state together with the parking lock gear 142.

Four shift ranges are established in the automatic transmission 102 in accordance with the operating state of the speed change mechanism 120, the hydraulic circuit 130, and the parking lock mechanism 140. That is, the P range is established when the shift speed for shutting off power transfer is established in the speed change mechanism 120 with the output shaft of the automatic transmission 102 in the locked state. The N range is established when the shift speed for shutting off power transfer is established in the speed change mechanism 120 with the output shaft of the automatic transmission 102 in the unlocked state. The D range is established when the shift speed for forward travel is established in the speed change mechanism 120 with the output shaft of the automatic transmission 102 in the unlocked state. The R range is established when the shift speed for reverse travel is established in the speed change mechanism 120 with the output shaft of the automatic transmission 102 in the unlocked state.

Next, the switching mechanism will be described. As illustrated in FIG. 1, the automatic transmission 102 includes a switching mechanism 110 for switching among the four shift ranges described above. The most part of the switching mechanism 110 is positioned inside the case 102a.

As illustrated in FIG. 3, the switching mechanism 110 includes a manual shaft 113, a detent plate 114, a detent spring 111, a first rod 116, and a second rod 117.

The manual shaft 113 has a stepped bar shape. The manual shaft 113 penetrates the case 102a. A first end portion 113a of the manual shaft 113 is positioned outside the case 102a. The first end portion 113a of the manual shaft 113 is connected to an actuator unit 10 to be discussed later. The first end portion 113a is not illustrated in FIG. 3. A second end portion 113b of the manual shaft 113 is positioned inside the case 102a. The manual shaft 113 is supported by a wall portion of the case 102a so as to be rotatable about the central axis of the manual shaft 113. The manual shaft 113 receives power from the actuator unit 10 to be rotated.

Figure 2:
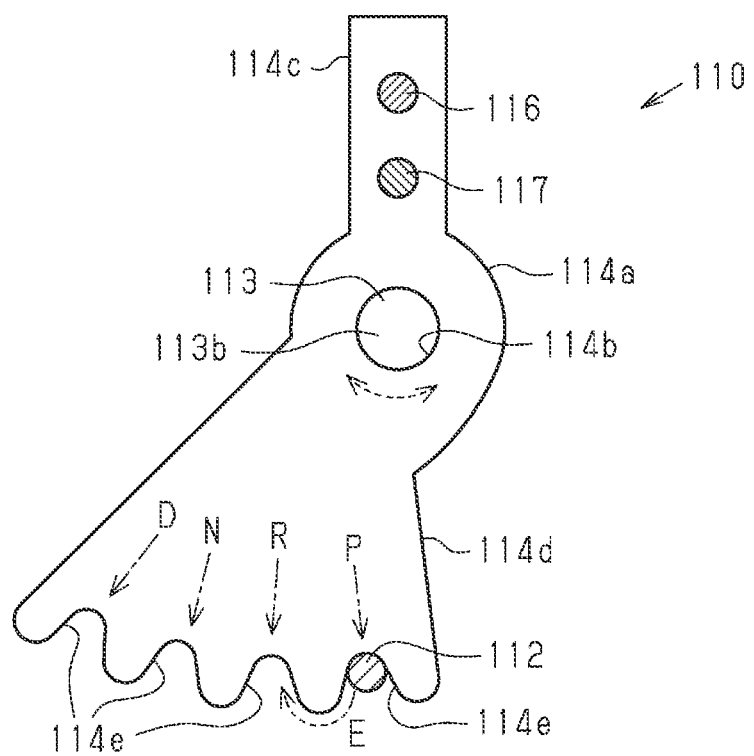
FIG. 2 is a plan view of a switching mechanism provided in an automatic transmission illustrated in FIG. 3.

The detent plate 114 has a flat plate shape. The detent plate 114 includes a middle portion 114a, a first extension portion 114c, and a second extension portion 114d. The middle portion 114a has a circular ring shape. The second end portion 113b of the manual shaft 113 is fixed to an inner peripheral surface 114b of the middle portion 114a. As illustrated in FIG. 2, the first extension portion 114c and the second extension portion 114d extend in opposite directions from the outer peripheral surface of the middle portion 114a. The first extension portion 114c has a generally rectangular shape as viewed in plan. The second extension portion 114d has a generally sector shape as viewed in plan. The top portion of the second extension portion 114d has an undulating shape. That is, the second extension portion 114d includes four valleys 114e in the arcuate portion of the sector. The detent plate 114 is rotated together with the manual shaft 113. The four valleys 114e in the second extension portion 114d are provided to position the detent plate 114 at four rotational positions. The four rotational positions are set for the respective shift ranges. The four valleys 114e are arranged in the order of one for the P range, one for the R range, one for the N range, and one for the D range, for example, in the circumferential direction of the arcuate portion of the sector of the second extension portion 114d.

As illustrated in FIG. 3, the detent spring 111 includes a spring body 115 and an engagement pin 112. The spring body 115 is an elongated plate spring. A first end portion 115a of the spring body 115 is fixed inside the case 102a by a fixing structure (not illustrated). A second end portion 115b of the spring body 115 is bifurcated. The engagement pin 112 extends between the two branches of the second end portion 115b of the spring body 115. As illustrated in FIG. 2, the engagement pin 112 is engaged with one of the four valleys 114e of the second extension portion 114d of the detent plate 114. The engagement pin 112 is pressed against a valley 114e of the second extension portion 114d by the elastic force of the spring body 115. That is, the engagement pin 112 positions the detent plate 114 at a rotational position corresponding to the valley 114e in which the engagement pin 112 is presently positioned. When the detent plate 114 is rotated, the engagement pin 112 is engaged with another valley 114e while being displaced in accordance with the undulating shape of the second extension portion 114d through elastic deformation of the spring body 115.

As illustrated in FIG. 3, the first rod 116 has a bar shape. A first end portion of the first rod 116 is connected to the first extension portion 114c. A second end portion of the first rod 116 is coupled to the parking lock mechanism 140 via a first coupling mechanism, although not illustrated. When the detent plate 114 is rotated, the first rod 116 causes the parking pawl 144 of the parking lock mechanism 140 to operate. Accordingly, the parking lock gear 142 is switched to the locked state or the unlocked state. The respective positions of the valleys 114e of the detent plate 114 are adjusted in correspondence with the operation position of the parking pawl 144 such that the parking lock gear 142 is in the locked state when the detent plate 114 is at a rotational position for the P range and the parking lock gear 142 is in the unlocked state when the detent plate 114 is at the other rotational positions.

The second rod 117 has a bar shape. A first end portion of the second rod 117 is connected to the first extension portion 114c. A second end portion of the second rod 117 is coupled to a spool of the valve 134 in the hydraulic circuit 130 via a second coupling mechanism, although not illustrated. When the detent plate 114 is rotated, the second rod 117 causes the spool of the valve 134 to operate. Accordingly, the path through which working oil flows is switched in the hydraulic circuit 130. The respective positions of the valleys 114e of the detent plate 114 are adjusted in correspondence with the structure of the hydraulic circuit 130 such that a flow path for a corresponding shift range is formed when the detent plate 114 is at a rotational position for each shift range.

Next, a basic configuration of the actuator unit will be described. As illustrated in FIG. 1, the automatic transmission 102 includes the actuator unit 10 that drives the switching mechanism 110. The actuator unit 10 is positioned outside the case 102a.

Figure 4:
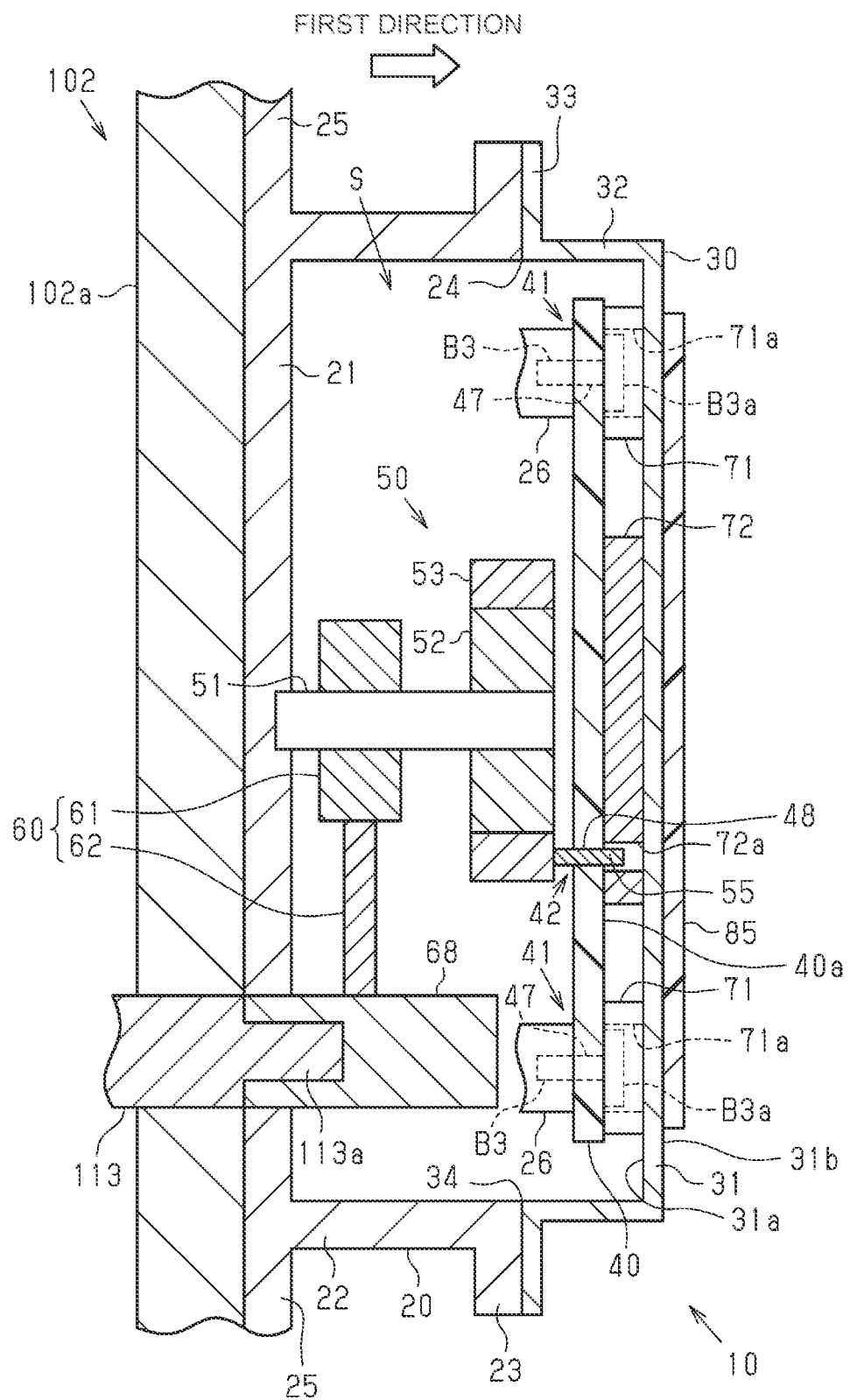
FIG. 4 is a sectional view of an actuator unit according to an embodiment of the present disclosure.

As illustrated in FIG. 4, the actuator unit 10 includes a housing 20 and a cover 30. The housing 20 is made of an aluminum alloy. The housing 20 is of a box type. Specifically, the housing 20 includes an end wall 21, a peripheral wall 22, a flange 23, and an opening 24. The end wall 21 has the shape of a rectangular flat plate. The peripheral wall 22 extends from the outer edge of the end wall 21. The peripheral wall 22 is continuous over the entire outer edge of the end wall 21. That is, the peripheral wall 22 has a rectangular tube shape. The flange 23 projects outward from the peripheral wall 22. The flange 23 is positioned at an end portion of the peripheral wall 22 on the opposite side of the end wall 21. The flange 23 is continuous over the entire end portion of the peripheral wall 22 on the opposite side of the end wall 21. That is, the flange 23 has a rectangular frame shape. The opening 24 is a space surrounded by the peripheral wall 22 at an end portion of the peripheral wall 22 on the opposite side of the end wall 21. The housing 20 opens to the outside through the opening 24.

The housing 20 includes four bosses 26. Only two of the four bosses 26 are illustrated in FIG. 4. The bosses 26 project from the end wall 21 toward the opening 24. The bosses 26 are positioned in the vicinity of the four corners of the end wall 21. The bosses 26 are in a cylindrical shape. The projection lengths of the bosses 26 are equal to each other.

Figure 5:
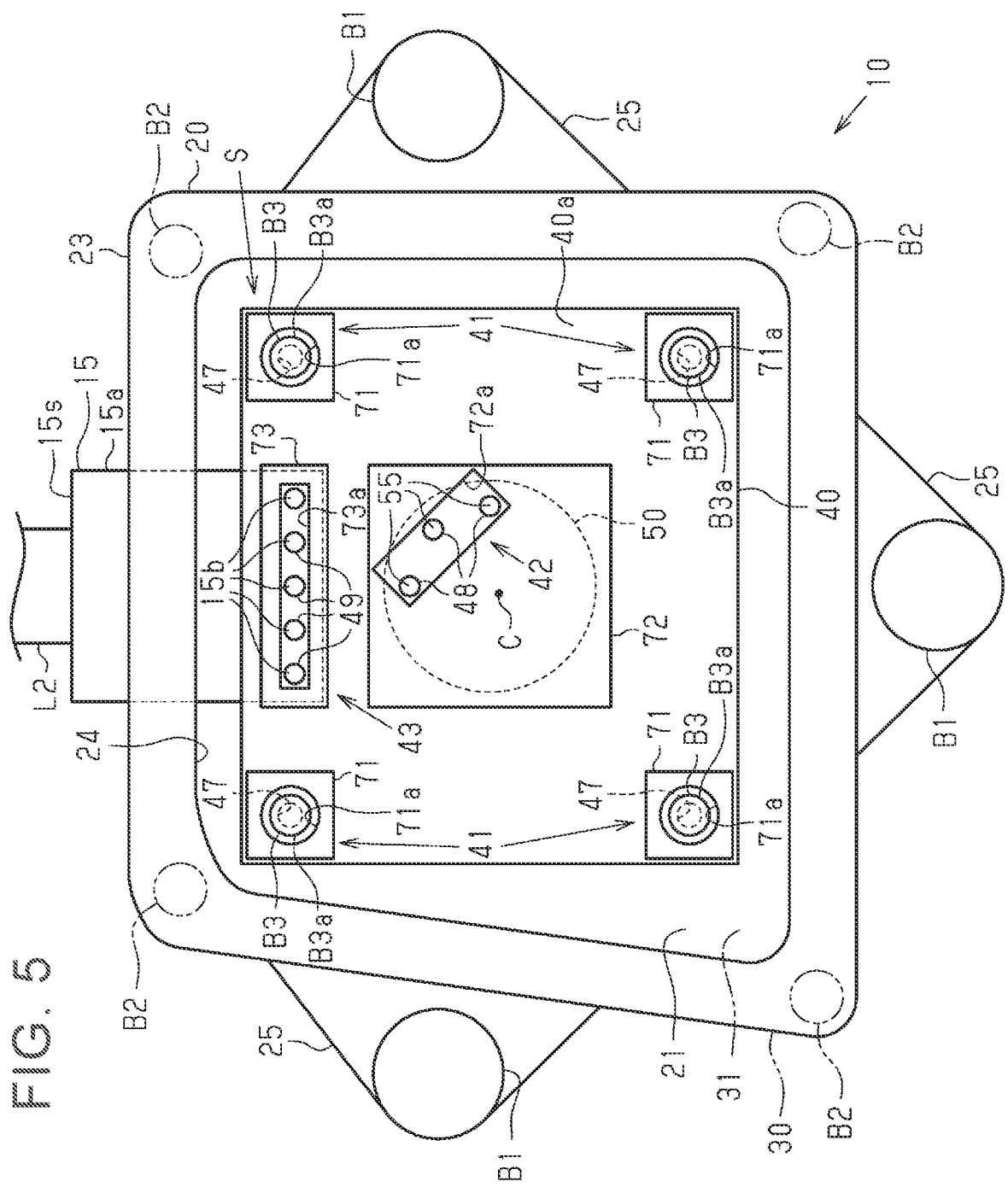
FIG. 5 is a plan view of the actuator unit with a cover removed.

As illustrated in FIG. 5, the housing 20 includes three fastening portions 25. The three fastening portions 25 project outward from the peripheral wall 22. The three fastening portions 25 are positioned at an end portion of the peripheral wall 22 on the end wall 21 side. The three fastening portions 25 project in different directions. A bolt B1 penetrates each of the three fastening portions 25. The bolts B1 are coupled to the case 102a of the automatic transmission 102. As a result, the housing 20 is fixed to the case 102a.

The cover 30 is made of iron-based metal. That is, the cover 30 is a magnetic body. As illustrated in FIG. 4, the cover 30 is of a box type, as with the housing 20. That is, the cover 30 includes an end wall 31, a peripheral wall 32, a flange 33, and an opening 34. The end wall 31 has the shape of a rectangular flat plate. The end wall 31 serves as the first wall. The vertical and transverse dimensions of the end wall 31 are generally the same as the vertical and transverse dimensions of the end wall 21 of the housing 20. The peripheral wall 32 extends from the outer edge of the end wall 31. The peripheral wall 32 is continuous over the entire outer edge of the end wall 31. That is, the peripheral wall 32 has a rectangular tube shape. The axial dimension of the peripheral wall 32 is shorter than the axial dimension of the peripheral wall 22 of the housing 20. The flange 33 projects outward from the peripheral wall 32. The flange 33 is positioned at an end portion of the peripheral wall 32 on the opposite side of the end wall 31. The flange 33 is continuous over the entire end portion of the peripheral wall 32 on the opposite side of the end wall 31. That is, the flange 33 has a rectangular frame shape. The thickness of each wall portion of the cover 30 is smaller than the thickness of each wall portion of the housing 20. The opening 34 is a space surrounded by the peripheral wall 32 at an end portion of the peripheral wall 32 on the opposite side of the end wall 31. The cover 30 opens to the outside through the opening 34.

As illustrated in FIG. 4, an inner face 31a of the end wall 31 of the cover 30, the inner face 31a facing the opening 34 of the cover 30, and an outer face 31b on the opposite side of the inner face 31a serve as the main surface of the end wall 31. That is, the main surface is a surface with the largest area among the outer surfaces of the end wall 31.

The opening 34 of the cover 30 faces the opening 24 of the housing 20. Particularly, the positions of the respective opening edges of the cover 30 and the housing 20 coincide with each other. Further, the flange 33 of the cover 30 and the flange 23 of the housing 20 face each other. In this state, the cover 30 and the housing 20 are integrated with each other. Specifically, a plurality of bolts B2 penetrates the flange 33 of the cover 30 and the flange 23 of the housing 20. The bolts B2 integrally fix the cover 30 and the housing 20 to each other. The cover 30 covers the opening 24 of the housing 20 with the cover 30 and the housing 20 integrally fixed to each other. A space surrounded by the end wall 31 and the peripheral wall 32 of the cover 30 and the end wall 21 and the peripheral wall 22 of the housing 20 constitutes a housing space S. That is, the housing space S is defined inside the cover 30 and the housing 20.

As illustrated in FIG. 4, the actuator unit 10 includes a motor 50. The motor 50 is positioned in the housing space S. As illustrated in FIG. 5, the motor 50 is positioned in the vicinity of the center of the end wall 31 as viewed in a direction that is orthogonal to the main surface of the end wall 31 of the cover 30 (hereinafter referred to as "as viewed in the orthogonal plan view"). In FIG. 5, the position of the end wall 31 of the cover 30 is indicated by a long-dashed double-short dashed leader line. The motor 50 is a three-phase motor. As illustrated in FIG. 4, the motor 50 includes a stator 53, a rotor 52, a rotor shaft 51, and three terminal pins 55. Only one of the three terminal pins 55 is illustrated in FIG. 4. The stator 53 has a cylindrical shape. The stator 53 includes a coil. The stator 53 is fixed to the housing 20 via a fixing structure (not illustrated). The rotor 52 has a cylindrical shape. The rotor 52 is positioned inside the stator 53. The central axis of the rotor 52 coincides with the central axis of the stator 53. The rotor 52 is rotatable with respect to the stator 53. The rotor shaft 51 has a bar shape. The rotor shaft 51 penetrates the rotor 52. The central axis of the rotor shaft 51 coincides with the central axis of the rotor 52. The central axis of the rotor shaft 51 is generally orthogonal to the end wall 21 of the housing 20. The first end portion of the rotor shaft 51 reaches the end wall 21 of the housing 20. The first end portion of the rotor shaft 51 is rotatably supported by the end wall 21 of the housing 20. The rotor shaft 51 is rotated together with the rotor 52. Each terminal pin 55 has a bar shape. The terminal pins 55 are fixed to the stator 53. The terminal pins 55 project from the stator 53 toward the end wall 31 of the cover 30. The terminal pins 55 supply power to the stator 53. When power is supplied to the stator 53, the rotor shaft 51 is rotated together with the rotor 52. That is, the motor 50 generates a rotation force. The rotor shaft 51 is rotated in both forward and reverse directions in a certain range in the circumferential direction. The certain range is approximately 45 degrees when converted into degrees.

The actuator unit 10 includes an output shaft 68. The most part of the output shaft 68 is positioned in the housing space S. The output shaft 68 has a bar shape. The output shaft 68 is disposed in parallel with the rotor shaft 51. A first end portion of the output shaft 68 penetrates the end wall 21 of the housing 20. The first end portion of the output shaft 68 is rotatably supported by the end wall 21 of the housing 20. The first end portion of the output shaft 68 is coupled to the first end portion 113a of the manual shaft 113 of the switching mechanism 110. The central axis of the output shaft 68 and the central axis of the manual shaft 113 coincide with each other. The output shaft 68 is rotated together with the manual shaft 113.

The actuator unit 10 includes a speed reduction mechanism 60. The speed reduction mechanism 60 includes a drive gear 61 and a driven gear 62. The drive gear 61 and the driven gear 62 are positioned in the housing space S. The drive gear 61 is a circular externally toothed gear. The driven gear 62 is a sector-shaped externally toothed gear. The central angle of the sector of the driven gear 62 is slightly larger than 45 degrees. The drive gear 61 is connected to the rotor shaft 51. The driven gear 62 is connected to the output shaft 68. The drive gear 61 and the driven gear 62 are meshed with each other. The speed reduction mechanism 60 amplifies the rotational force of the rotor shaft 51, and transfers the amplified rotational force to the output shaft 68. The rotational force is transferred to the manual shaft 113. That is, the rotational force is used as a drive force for driving the switching mechanism 110.

As illustrated in FIG. 5, the actuator unit 10 includes a connector 15. The connector 15 includes a main body 15a and five terminal pins 15b. The main body 15a penetrates the peripheral wall 22 of the housing 20. That is, the main body 15a includes a portion positioned inside the housing space S and a portion positioned outside the housing space S. An end portion of the portion of the main body 15a positioned outside the housing space S serves as a connection portion 15s. The wire L2 that extends from the shift ECU 104d is connected to the connection portion 15s. Each terminal pin 15b has a bar shape. The terminal pins 15b project from the portion of the main body 15a positioned inside the housing space S. The terminal pins 15b extend toward the end wall 31 of the cover 30. The terminal pins 15b are positioned in the vicinity of one of the four sides of the rectangular shape of the end wall 31 of the cover 30 as viewed in the orthogonal plan view. The connector 15 is not illustrated in FIG. 4.

Next, a control substrate will be described. The actuator unit 10 includes a control substrate 40. The control substrate 40 includes printed wiring and various electronic components mounted on the printed wiring, for example. The control substrate 40 may be constituted as one or more processors that execute various processes in accordance with a computer program (software). The control substrate 40 may be constituted as one or more dedicated hardware circuits such as application specific integrated circuits (ASICs) that execute at least a part of the various processes, or circuitry that includes a combination of such hardware circuits. The processor includes a CPU and memories such as a RAM and a ROM. The memories store program codes or instructions configured to cause the CPU to execute the processes. The memories, that is, computer readable media, include any available medium that is accessible by a general-purpose or dedicated computer. The CPU controls the motor 50 by executing the program codes in the memories.

As illustrated in FIG. 4, the control substrate 40 is positioned in the housing space S. As illustrated in FIG. 5, the control substrate 40 has the shape of a rectangular flat plate. The vertical and transverse dimensions of the control substrate 40 are smaller than the vertical and transverse dimensions of the end wall 31 of the cover 30. A surface with the largest area among the outer surfaces of the control substrate 40 is referred to as the main surface from the same viewpoint as the end wall 31 of the cover 30. That is, the control substrate 40 includes two main surfaces on the front and back sides thereof.

The control substrate 40 includes four non-through holes 47. The non-through holes 47 are positioned at respective four corners of the control substrate 40. As illustrated in FIG. 4, the non-through holes 47 penetrate the control substrate 40 to open in both the two main surfaces of the control substrate 40.

The control substrate 40 is fixed to the housing 20 using the four non-through holes 47, the four bolts B3 inserted into the non-through holes 47, and the four bosses 26 of the housing 20. Specifically, the control substrate 40 is fixed to the housing 20 under the following arrangement. That is, as illustrated in FIG. 4, a first surface 40a that is one of the two main surfaces of the control substrate 40 faces the inner face 31a of the end wall 31 of the cover 30. The four corners of the control substrate 40 are positioned at the projecting ends of the four bosses 26. The non-through holes 47 and the bosses 26 are positioned at overlapping positions as viewed in the orthogonal plan view. In this state, the bolts B3 penetrate the respective non-through holes 47. The bolts B3 are fixed to the bosses 26. The non-through holes 47 and portions of the control substrate 40 in contact with the projecting ends of the bosses 26 serve as first fixing portions 41 of the control substrate 40 at which the control substrate 40 is fixed to the housing 20. The control substrate 40 and the end wall 31 of the cover 30 are parallel to each other when the control substrate 40 is fixed to the housing 20. Thus, the orthogonal plan view also corresponds to a plan view seen in a direction that is orthogonal to the main surfaces of the control substrate 40.

As illustrated in FIG. 4, head portions B3a of the bolts B3 that penetrate the non-through holes 47 are positioned close to the end wall 31 of the cover 30 compared to the first surface 40a of the control substrate 40. That is, the head portions B3a of the bolts B3 serve as protrusions that project toward the end wall 31 of the cover 30 from the first surface 40a of the control substrate 40.

The direction toward the end wall 31 of the cover 30 as viewed from the end wall 21 of the housing 20 is referred to as a first direction. The positional relationship among the control substrate 40, the motor 50, and the connector 15 in the first direction with the control substrate 40 fixed to the bosses 26 is as follows. The projecting ends of the bosses 26 project to a position close to the end wall 31 of the cover 30 compared to the stator 53 of the motor 50 in the first direction. As a result, the control substrate 40 is positioned between the stator 53 and the end wall 31 of the cover 30. The projecting ends of the bosses 26 also project to a position close to the end wall 31 of the cover 30 compared to the main body 15a of the connector 15 in the first direction. As a result, the control substrate 40 is positioned between the main body 15a of the connector 15 and the end wall 31 of the cover 30.

As illustrated in FIG. 5, the control substrate 40 includes three first through holes 48. The first through holes 48 are positioned in the vicinity of the center of the control substrate 40. The first through holes 48 penetrate the control substrate 40 to open in both the two main surfaces of the control substrate 40. The inner faces of the first through holes 48 are plated with copper, for example. The first through holes 48 are positioned at positions overlapping the terminal pins 55 of the motor 50 as viewed in the orthogonal plan view. As illustrated in FIG. 4, the terminal pins 55 of the motor 50 penetrate the first through holes 48. The terminal pins 55 are fixed by soldering to the inner faces of the first through holes 48. As a result, the control substrate 40 and the motor 50 are electrically connected to each other. As illustrated in FIG. 5, the first through holes 48 serve as a second fixing portion 42 of the control substrate 40 at which the motor 50 is fixed to the control substrate 40. As illustrated in FIG. 4, the distal ends of the terminal pins 55 of the motor 50 reach a position close to the end wall 31 of the cover 30 compared to the first surface 40a of the control substrate 40 in the first direction. That is, the terminal pins 55 serve as protrusions that project toward the end wall 31 of the cover 30 from the first surface 40a of the control substrate 40.

As illustrated in FIG. 5, the control substrate 40 includes five second through holes 49. Only four of the five second through holes 49 are given reference signs in FIG. 5. The second through holes 49 are positioned at a position close to one of the four sides of the rectangular control substrate 40. The second through holes 49 penetrate the control substrate 40 to open in both the two main surfaces of the control substrate 40. The inner faces of the second through holes 49 are plated with copper, for example. The second through holes 49 are positioned at positions overlapping the terminal pins 15b of the connector 15 as viewed in the orthogonal plan view. The terminal pins 15b of the connector 15 penetrate the second through holes 49. The terminal pins 15b are fixed by soldering to the inner faces of the second through holes 49. As a result, the control substrate 40 and the connector 15 are electrically connected to each other. That is, the wire L2 that extends from the shift ECU 104d is connected to the control substrate 40 via the connector 15. The second through holes 49 serve as a third fixing portion 43 of the control substrate 40 at which the connector 15 is fixed to the control substrate 40. The distal ends of the terminal pins 15b of the connector 15 reach a position close to the end wall 31 of the cover 30 compared to the first surface 40a of the control substrate 40 in the first direction, although not illustrated in FIG. 4. That is, the terminal pins 15b serve as protrusions that project toward the end wall 31 of the cover 30 from the first surface 40a of the control substrate 40.

Next, the shock absorption material will be described. As illustrated in FIG. 5, the actuator unit 10 includes four first shock absorption materials 71, one second shock absorption material 72, and one third shock absorption material 73. Hereinafter, the shock absorption materials will be referred to as shock absorption materials with no reference signs when the shock absorption materials are described collectively, and will be referred to as the first shock absorption material 71, the second shock absorption material 72, and the third shock absorption material 73 when the shock absorption materials are described individually. The shock absorption materials are made of silicone gel. That is, a material of the shock absorption materials is gel. Each shock absorption material has a rectangular plate shape. The six shock absorption materials are positioned at positions not overlapping each other as viewed in the orthogonal plan view.

The four first shock absorption materials 71 have the same configuration. Therefore, one of the four first shock absorption materials 71 will be described below. As illustrated in FIG. 5, the first shock absorption material 71 is positioned in the vicinity of a corner of the rectangular control substrate 40 as viewed in the orthogonal plan view. The range in which the first shock absorption material 71 is present as viewed in the orthogonal plan view includes the first fixing portions 41.

As illustrated in FIG. 4, the first shock absorption material 71 is positioned between the control substrate 40 and the end wall 31 of the cover 30. The first shock absorption material 71 contacts both the first surface 40a of the control substrate 40 and the inner face 31a of the end wall 31. The first shock absorption material 71 includes a positioning hole 71a. The positioning hole 71a is a hole dented inward of the first shock absorption material 71 from an outer face of the first shock absorption material 71 that faces the control substrate 40. The positioning hole 71a further extends to an outer face of the first shock absorption material 71 that faces the end wall 31. The positioning hole 71a opens in the outer face of the first shock absorption material 71 that faces the end wall 31. That is, the positioning hole 71a penetrates the first shock absorption material 71.

As illustrated in FIG. 5, the opening edge of the positioning hole 71a surrounds the head portion B3a of the bolt B3 as viewed in the orthogonal plan view. That is, as illustrated in FIG. 4, the head portion B3a of the bolt B3 is positioned inside the positioning hole 71a. In FIGS. 4 and 5, the gap between the head portion B3a of the bolt B3 and the inner face of the positioning hole 71a is illustrated as exaggerated.

As illustrated in FIG. 5, the second shock absorption material 72 is positioned in the vicinity of the center of the end wall 31 of the cover 30 as viewed in the orthogonal plan view. The range in which the second shock absorption material 72 is present as viewed in the orthogonal plan view includes the second fixing portion 42. The range in which the second shock absorption material 72 is present as viewed in the orthogonal plan view also includes a geometric center C of the end wall 31 of the cover 30. An approximate position of the geometric center C is indicated in FIG. 5.

As illustrated in FIG. 4, the second shock absorption material 72 is positioned between the control substrate 40 and the end wall 31 of the cover 30, as with the first shock absorption material 71. The second shock absorption material 72 contacts both the first surface 40a of the control substrate 40 and the inner face 31a of the end wall 31. The second shock absorption material 72 includes a positioning hole 72a that is similar to that of the first shock absorption material 71. That is, the positioning hole 72a penetrates the second shock absorption material 72. As illustrated in FIG. 5, the opening edge of the positioning hole 72a surrounds the three terminal pins 55 of the motor 50 as viewed in the orthogonal plan view. As illustrated in FIG. 4, the terminal pins 55 are positioned inside the positioning hole 72a. In FIGS. 4 and 5, a gap between the terminal pins 55 and the inner face of the positioning hole 72a is illustrated as exaggerated.

As illustrated in FIG. 5, the third shock absorption material 73 is positioned in the vicinity of one of the four sides of the rectangular control substrate 40 as viewed in the orthogonal plan view. The range in which the third shock absorption material 73 is present as viewed in the orthogonal plan view includes the third fixing portion 43.

The third shock absorption material 73 is positioned between the control substrate 40 and the end wall 31 of the cover 30, as with the first shock absorption material 71 and the second shock absorption material 72, although not illustrated. The third shock absorption material 73 contacts both the first surface 40a of the control substrate 40 and the inner face 31a of the end wall 31. The third shock absorption material 73 includes a positioning hole 73a that is similar to those of the first shock absorption material 71 and the second shock absorption material 72. As illustrated in FIG. 5, the opening edge of the positioning hole 73a surrounds the five terminal pins 15b of the connector 15 as viewed in the orthogonal plan view. The terminal pins 15b are positioned inside the positioning hole 73a. The positioning holes of the shock absorption materials will be referred to simply as positioning holes with no reference signs when the positioning holes are described collectively from the same viewpoint as the shock absorption materials.

As illustrated in FIG. 4, the actuator unit 10 includes a vibration suppression material 85. The vibration suppression material 85 is made of rubber. The vibration suppression material 85 has the shape of a rectangular flat plate. The vertical and transverse dimensions of the vibration suppression material 85 are smaller than the vertical and transverse dimensions of the end wall 31 of the cover 30. The vibration suppression material 85 is positioned on the outer face 31b of the end wall 31 of the cover 30. The vibration suppression material 85 is bonded to the outer face 31b of the end wall 31 using an adhesive, for example. The vibration suppression material 85 covers the most part of the outer face 31b of the end wall 31.

The actuator unit 10 is configured as described above. The actuator unit 10 and the switching mechanism 110 constitute a shift device of a shift-by-wire type in which the shift range of the automatic transmission 102 is electrically switched.

Next, the function of the actuator unit according to the embodiment will be described. The shock absorption material suppresses vibration of the cover 30. In the following, a factor of vibration of the cover 30 will be described first, and the function of the shock absorption materials will be described subsequently.

When the driver of the vehicle 100 operates the shift lever 104a or the parking switch 104b, the shift ECU 104d calculates a new target shift range. The shift ECU 104d transmits the calculated target shift range to the control substrate 40 of the actuator unit 10. When the target shift range is received, the control substrate 40 drives the motor 50 based on the target shift range. A rotational force of the rotor shaft 51 of the motor 50 is transmitted to the manual shaft 113 via the speed reduction mechanism 60 and the output shaft 68. Then, the detent plate 114 is rotated together with the manual shaft 113. When the detent plate 114 is rotated, the engagement pin 112 that positions the detent plate 114 is moved from the valley 114e in which the engagement pin 112 is presently positioned to a different valley 114e as indicated by the dashed arrow E in FIG. 2.

The engagement pin 112 is pressed against the second extension portion 114d by the elastic force of the spring body 115. When the detent plate 114 is rotated, the engagement pin 112 starts moving from the valley 114e in which the engagement pin 112 is presently positioned, climbs over a mountain between the valleys 114e and 114e, and reaches the next valley 114e in the state of being pressed against the second extension portion 114d. The relationship of applying and receiving a force between the detent plate 114 and the engagement pin 112 is reversed during a period for which the engagement pin 112 is moved from the valley 114e in which the engagement pin 112 is presently positioned to the next valley 114e. Specifically, the rotation force of the detent plate 114 displaces the engagement pin 112 during a period since the engagement pin 112 starts moving from the valley 114e in which the engagement pin 112 is presently positioned until the engagement pin 112 climbs over a mountain. That is, the detent plate 114 inputs a force to the engagement pin 112. On the other hand, the pressing force of the engagement pin 112 rotates the detent plate 114 during a period since the engagement pin 112 has climbed over a mountain until the engagement pin 112 reaches the next valley 114e. That is, the engagement pin 112 inputs a force to the detent plate 114.

When the pressing force of the engagement pin 112 rotates the detent plate 114, the rotational speed of the manual shaft 113, and hence the rotational speed of the output shaft 68 of the actuator unit 10, become higher than the rotational speed of the rotor shaft 51. Then, meshing between the two gears of the speed reduction mechanism 60, which are interposed between the output shaft 68 and the rotor shaft 51, becomes unstable since the respective rotational speeds of the output shaft 68 and the rotor shaft 51 are different from each other. Then, rattling is caused between the two gears when the gears operate. In particular, the relationship of applying and receiving a force between the detent plate 114 and the engagement pin 112 is repeatedly reversed when the engagement pin 112 is moved to climb over a plurality of mountains. Accordingly, rattling is continuously caused between the gears. Rattling between the gears is transmitted to the housing 20 via the rotor shaft 51 to vibrate the housing 20. Vibration of the housing 20 is transmitted to the peripheral wall 32 of the cover 30, and further transmitted from the peripheral wall 32 to the end wall 31 of the cover 30. Vibration from the peripheral wall 32 on the four sides concentrates on the end wall 31. The end wall 31 of the cover 30 is vibrated in accordance with a force input in reverse from the detent plate 114 to the actuator unit 10 in this manner.

The natural frequency of the cover 30 is occasionally close to the frequency of vibration caused along with rattling between the gears because of factors such as the dimensions, the wall portion thickness, and the material of the cover 30. In this case, the end wall 31 of the cover 30 is vibrated remarkably when rattling between the gears is caused. Vibration of the end wall 31 may be perceived as noise by occupants of the vehicle 100.

There are constraints on the dimensions and the wall portion thickness of the cover 30, for reasons of suppressing interference with other components positioned outside the case 102a of the automatic transmission 102, for example. It is necessary that the cover 30 should be a magnetic body, because of the need to secure insulation from the control substrate 40. Thus, there are also restrictions on changing the natural frequency of the cover 30 by changing the dimensions, the wall portion thickness, the material, etc. of the cover 30.

Figure 6A:
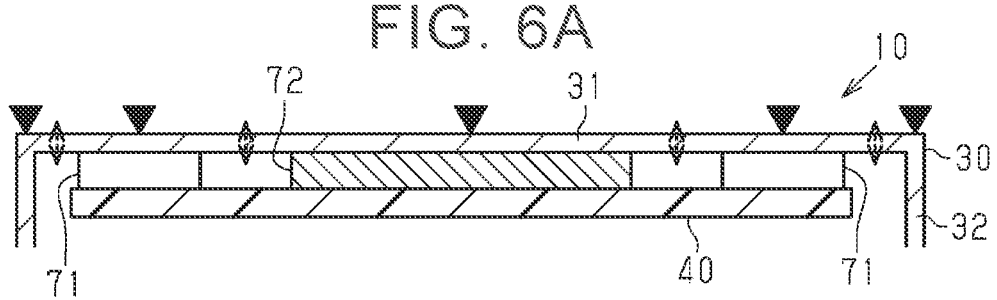
FIG. 6A illustrates a function of a shock absorption material disposed in the actuator unit.
Figure 6B:
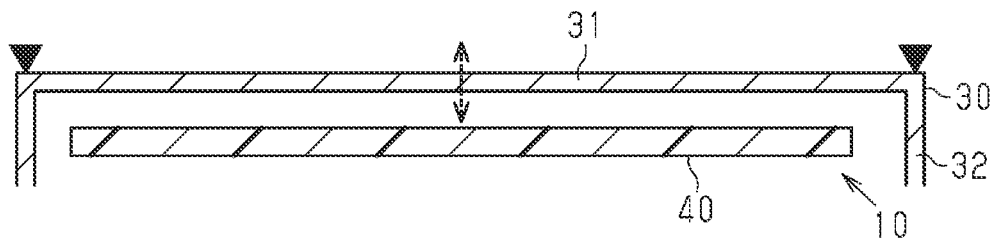
FIG. 6B illustrates a case where the shock absorption material is not provided in the actuator unit.

The shock absorption materials are provided in order to suppress the vibration of the cover 30 described above. It is assumed that the end wall 31 is vibrated with no shock absorption materials present between the end wall 31 of the cover 30 and the control substrate 40 as illustrated in FIG. 6B. In this case, the end wall 31 is vibrated with the sides of the rectangle serving as nodes of vibration and with a portion between the sides of the rectangle serving as an antinode of vibration. In FIG. 6B and FIG. 6A to be described below, locations that may serve as nodes of vibration are indicated with triangles for convenience.

When shock absorption materials such as the first shock absorption materials 71 and the second shock absorption material 72 are present between the end wall 31 and the control substrate 40 as illustrated in FIG. 6A, on the contrary, it is difficult for the end wall 31 to be vibrated at locations at which the shock absorption materials are present. Thus, the locations at which the shock absorption materials are present serve as nodes of vibration. The shock absorption materials are positioned between the sides of the rectangle of the end wall 31, that is, at portions originally supposed to serve as antinodes of vibration. That is, in the present embodiment in which the shock absorption materials are present, portions originally supposed to serve as antinodes of vibration serve as nodes of vibration. In this case, the distance between the nodes of vibration is short compared to a case where there are no shock absorption materials. As the distance between nodes of vibration is shorter, the amplitude of vibration at antinodes of vibration is lower. Thus, in the present embodiment in which the shock absorption materials are present, the amplitude of vibration at locations that serve as antinodes of vibration is low compared to a case where there are no shock absorption materials. The range of the dashed arrows in FIGS. 6A and 6B schematically represents an example of the magnitude of the amplitude of vibration of the end wall 31. The magnitude of the amplitude is represented as exaggerated for ease of understanding, and is different from the actual magnitude. The bolts B3, the terminal pins 55, and the positioning holes are not illustrated in FIGS. 6A and 6B.

Effects of the actuator unit according to the embodiment will be described. In the present embodiment, the shock absorption materials are provided between the end wall 31 of the cover 30 and the control substrate 40. When there are shock absorption materials, as described above in relation to the function, locations of the end wall 31 that would serve as antinodes of vibration when there were no shock absorption materials serve as nodes of vibration, because of the presence of the shock absorption materials. Thus, additional nodes are generated between nodes of vibration of the end wall 31, so that the distance between the nodes of vibration becomes shorter. Therefore, in the present embodiment in which the shock absorption materials are provided, the amplitude of vibration at antinodes of vibration of the end wall 31 becomes lower. In the present embodiment, further, the vibration suppression material 85 is attached to the end wall 31. The vibration suppression material 85 covers the most part of the outer face 31b of the end wall 31. Therefore, vibration of the end wall 31 can be suppressed as a whole. In the present embodiment, the volume of noise caused along with vibration of the end wall 31 can be suppressed by the function of the shock absorption materials and the vibration suppression material 85.

The control substrate 40 is fixed to the bosses 26 of the housing 20 at the first fixing portions 41. Therefore, vibration of the housing 20 is occasionally transmitted to the control substrate 40. When vibration of the housing 20 is transmitted to the control substrate 40, the vibration of the housing 20 is input to the control substrate 40 via the first fixing portions 41, and transmitted from the first fixing portions 41 to other locations of the control substrate 40. In that event, the first fixing portions 41, which are locations of fixation, are difficult to be vibrated. Thus, the first fixing portions 41 serve as nodes of vibration of the control substrate 40. When the control substrate 40 is vibrated, the second fixing portion 42, which is a location of fixation of the control substrate 40 to the terminal pins 55 of the motor 50, is also difficult to be vibrated. Therefore, the second fixing portion 42 serves as a node of vibration of the control substrate 40. When the control substrate 40 is vibrated, the third fixing portion 43, which is a location of fixation of the control substrate 40 to the terminal pins 15b of the connector 15, is also difficult to be vibrated. Therefore, the third fixing portion 43 serves as a node of vibration of the control substrate 40. In the present embodiment, the shock absorption materials are disposed at the first fixing portions 41, the second fixing portion 42, and the third fixing portion 43 that serve as nodes of vibration of the control substrate 40. Thus, it is possible to suppress transmission of vibration of the control substrate 40 to the end wall 31 of the cover 30 via the shock absorption materials, even when the vibration of the housing 20 is transmitted to vibrate the control substrate 40. Even when the control substrate 40 is vibrated, incidentally, sound caused along with the vibration of the control substrate 40 is blocked by the wall portions of the housing 20 and the cover 30. Thus, vibration of the control substrate 40 does not incur noise.

In the present embodiment, each of the first shock absorption materials 71 includes the positioning hole 71a that is dented from an outer face that faces the control substrate 40. Meanwhile, each of the head portions B3a of the bolts B3 constitutes a protrusion that projects from the first surface 40a of the control substrate 40. The head portion B3a of the bolt B3 is positioned inside the positioning hole 71a. The first shock absorption material 71 can be positioned with respect to the control substrate 40 by utilizing a relationship between the protrusion and the hole of a structure in which the protrusion is inserted into the hole in this manner. Consequently, it is possible to suppress misalignment of the first shock absorption material 71 from a suitable position for suppressing vibration of the control substrate 40.

In the present embodiment, the terminal pins 55 of the motor 50 are positioned inside the positioning hole 72a of the second shock absorption material 72, as with the first shock absorption material 71. Thus, the second shock absorption material 72 can be positioned with respect to the control substrate 40. It is possible to suppress misalignment of the second shock absorption material 72 from a suitable position for suppressing vibration of the control substrate 40. In the present embodiment, similarly, the terminal pins 15b of the connector 15 are positioned inside the positioning hole 73a of the third shock absorption material 73. Thus, the third shock absorption material 73 can be positioned with respect to the control substrate 40. It is possible to suppress misalignment of the third shock absorption material 73 from a suitable position for suppressing vibration of the control substrate 40.

In the present embodiment, the second shock absorption material 72 is positioned at a position including the geometric center C of the end wall 31 of the cover 30 as viewed in the orthogonal plan view. If there were no second shock absorption material 72, the geometric center C of the end wall 31 would highly likely serve as an antinode of vibration of the end wall 31. That is, in the present embodiment, the second shock absorption material 72 is disposed at a location that is likely to serve as an antinode of vibration of the end wall 31. Consequently, vibration of the end wall 31 can be suppressed effectively.

In the present embodiment, six shock absorption materials are provided between the control substrate 40 and the cover 30. The six shock absorption materials are positioned at positions not overlapping each other as viewed in the orthogonal plan view. By disposing the six shock absorption materials at different positions as viewed in the orthogonal plan view, it is possible to provide six nodes of vibration, which is equal to the number of the shock absorption materials. As described above, the distance between the nodes is shorter as the number of nodes of vibration is larger, and the amplitude of vibration at the positions of antinodes of vibration can be suppressed. Thus, vibration of the end wall 31 can be suppressed effectively in the present embodiment in which a plurality of the nodes of vibration is provided.

Figure 7:
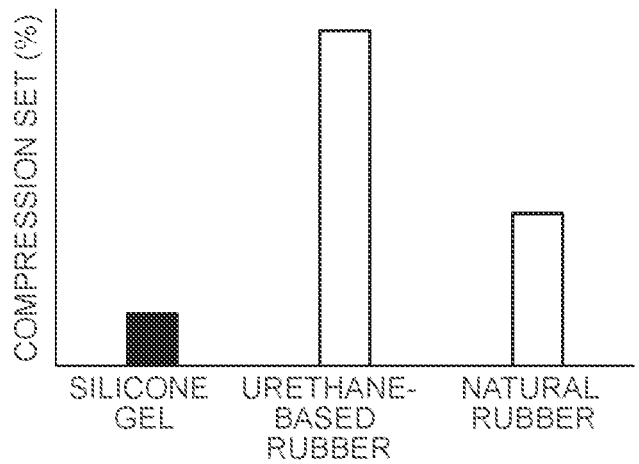
FIG. 7 indicates a difference in compression set of the shock absorption material among materials.

In the present embodiment, the shock absorption materials are made of silicone gel. It is conceivable that the shock absorption materials are made of urethane-based rubber or natural rubber, for example. As indicated in FIG. 7, shock absorption materials made of silicone gel have a low compression set compared to shock absorption materials made of urethane-based rubber or natural rubber. The compression set is an index representing a difficulty of restoring an object to an original shape when the object has been released from a compressed state. A low compression set means that the object can easily restore the original shape. That is, shock absorption materials made of silicone gel are basically not deformed significantly when a force is input to the shock absorption materials, and can maintain, over a long period, elastic properties required to suppress vibration.

Figure 8:
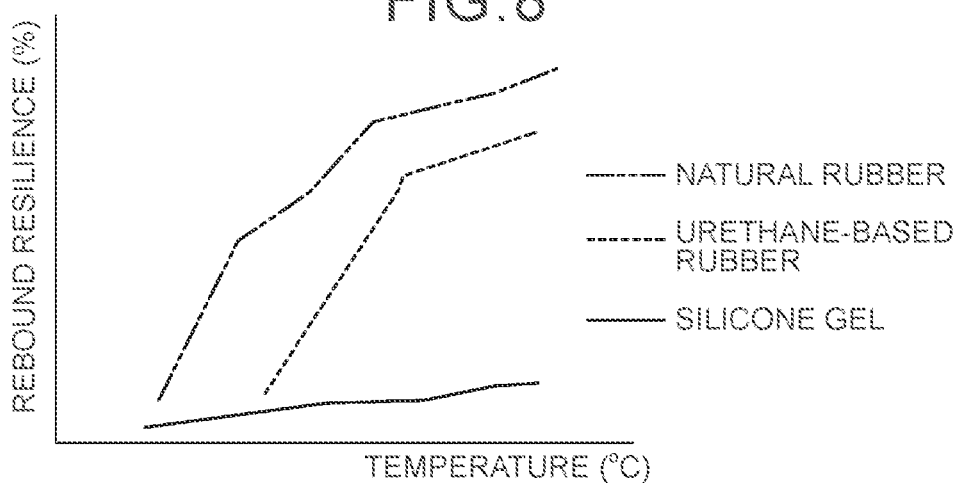
FIG. 8 indicates a difference in a relationship between rebound resilience of the shock absorption material and temperature among materials.

As indicated in FIG. 8, in addition, shock absorption materials made of silicone gel have a low rebound resilience compared to shock absorption materials made of urethane-based rubber or natural rubber, irrespective of the temperature. The rebound resilience is an index of a rebound force against a force applied to an object. A lower rebound resilience means that the object absorbs impact and vibration better. That is, shock absorption materials made of silicone gel absorb impact and vibration well compared to shock absorption materials made of the rubber described above, irrespective of the ambient temperature of the shock absorption materials. Further, the rebound resilience of shock absorption materials made of silicone gel does not depend significantly on the temperature. That is, shock absorption materials made of silicone gel absorb impact and vibration well in both a low-temperature environment and a high-temperature environment. The temperature in an engine compartment in which the automatic transmission 102 is housed can be as high as 100° C. or higher, for example. With shock absorption materials made of silicone gel, vibration of the end wall 31 can be suppressed even when the shock absorption materials are exposed to such high temperatures.

Modifications of the embodiment of the present disclosure will be described. The present embodiment can be implemented as modified as follows. The present embodiment and the following modifications can be implemented in combination with each other within a technically consistent range.

The material of the shock absorption materials is not limited to that according to the above embodiment. The material of the shock absorption materials may be any material that makes it possible to generate nodes of vibration in the end wall 31 of the cover 30 because of the presence of the shock absorption materials. The material of the shock absorption materials is preferably elastic in order to generate nodes of vibration in the end wall 31 while suppressing input of a stress from the end wall 31 to the control substrate 40 caused along with vibration of the end wall 31.

When a plurality of shock absorption materials is installed as in the above embodiment, the material of the shock absorption materials may be different among the shock absorption materials. The material of the vibration suppression material 85 is not limited to that according to the above embodiment. The material of the vibration suppression material 85 may be any material that can suppress vibration of the end wall 31 of the cover 30 to any degree.

The vibration suppression material 85 may be omitted. The material of the housing 20 is not limited to that according to the above embodiment. The material of the housing 20 may be any material that can impart suitable rigidity to the housing 20.

The material of the cover 30 is not limited to that according to the above embodiment. For example, the distance between the control substrate 40 and the end wall 31 may be considerably long, depending on the projecting length of the bosses 26. Accordingly, the cover 30 may not necessarily be a magnetic body when the control substrate 40 and the cover 30 clearly do not contact each other.

The number of the shock absorption materials is not limited to that according to the above example. The number of the shock absorption materials may be more or less than that according to the above embodiment. It is only necessary that at least one shock absorption material should be present. When at least one shock absorption material is present, a node of vibration can be generated in the end wall 31 of the cover 30 by the shock absorption material.

The positions of the shock absorption materials as viewed in the orthogonal plan view are not limited to those according to the above embodiment. The positions of the shock absorption materials as viewed in the orthogonal plan view may be positioned at positions deviating from the geometric center C of the end wall 31. Nodes of vibration can be generated in the end wall 31 by the shock absorption materials when the shock absorption materials are present between the end wall 31 and the control substrate 40, irrespective of the positions of the shock absorption materials.

When the number of the shock absorption materials is changed from that according to the above embodiment or the positions of the shock absorption materials are changed from those according to the above embodiment as in the above modifications, the shock absorption materials may be positioned at positions deviating from the first fixing portions 41 as viewed in the orthogonal plan view. Similarly, the shock absorption material may be positioned at a position deviating from the second fixing portion 42 as viewed in the orthogonal plan view. Similarly, the shock absorption material may be positioned at a position deviating from the third fixing portion 43 as viewed in the orthogonal plan view. When a shock absorption material is positioned at a position overlapping at least one of the first fixing portions 41, the second fixing portion 42, and the third fixing portion 43 as viewed in the orthogonal plan view, it is possible to suppress transmission of vibration from the control substrate 40 to the end wall 31 of the cover 30 at such a location.

The protrusions that project from the first surface 40*a* of the control substrate 40 are not limited to the components described in relation to the above embodiment. Any component that projects from the first surface 40*a* of the control substrate 40 other than those described in relation to the above embodiment may serve as a protrusion for positioning a shock absorption material. A shock absorption material may be disposed at the position at which the protrusion is present so that the protrusion is positioned in a positioning hole of the shock absorption material. Alternatively, the control substrate 40 may include a protrusion for positioning a shock absorption material, for example.

The shape and the dimensions of the shock absorption materials are not limited to those according to the above embodiment. The shape and the dimensions of the shock absorption materials are not limited as long as nodes of vibration can be generated in the end wall 31. The positioning holes may not open in a surface that faces the end wall 31. The positioning holes may be holes dented inward of the first shock absorption materials 71 from a surface that faces the control substrate 40. The protrusions that project from the control substrate 40 can be disposed inside such holes.

The positioning holes may not be provided. When the positions of the shock absorption materials are changed as viewed in the orthogonal plan view as in the above modification, there may be no protrusions that project from the control substrate 40, depending on the positions of the shock absorption materials. The positioning holes are not necessary when the shock absorption materials are disposed at such locations.

The shock absorption materials with no positioning holes may be disposed at positions at which the protrusions that project from the control substrate 40 are present. In this case, the protrusions intrude into the shock absorption materials. Thus, the shock absorption materials can be positioned by the protrusions.

The configuration of the control substrate 40 is not limited to that according to the above embodiment. The shape of the control substrate 40 may be changed from that according to the above embodiment. The shape of the control substrate 40 may be a polygon other than a rectangle. The control substrate 40 may not be in a flat plate shape. The control substrate 40 may be curved, for example.

The respective numbers of the non-through holes 47, the first through holes 48, and the second through holes 49 are not limited to those according to the above embodiment. The number of the non-through holes 47 may be changed in accordance with the number of the bosses 26 of the housing 20. Similarly, the number of the first through holes 48 may be changed in accordance with the number of the terminal pins 55 of the motor 50. The number of the second through holes 49 may be changed in accordance with the number of the terminal pins 15*b* of the connector 15.

The shape of the end wall 31 of the cover 30 is not limited to that according to the above embodiment. The end wall 31 may be a polygon other than a rectangle. The end wall 31 may not be in a flat plate shape as long as the end wall 31 faces the control substrate 40. The end wall 31 may be curved, for example.

The overall shape of the cover 30 is not limited to that according to the above embodiment. For example, the peripheral wall 32 may not be provided. The opening 24 of the housing 20 may be covered by the end wall 31. The cover 30 may be in any shape that allows the cover 30 to cover the opening 24 of the housing 20.

The overall shape of the housing 20 is not limited to that according to the above embodiment. It is only necessary that the housing 20 should include an opening 24. The housing 20 may be shaped so as to define the housing space S together with the cover 30.

The configuration of the bosses 26 is not limited to that according to the above embodiment. For example, the bosses 26 may be provided on wall portions that project from the peripheral wall 22 of the housing 20. It is only necessary that the bosses 26 should be used to fix the control substrate 40 so as to face the end wall 31 of the cover 30.

The number of the bosses 26 is not limited to that according to the above embodiment. When at least one boss 26 is provided, the control substrate 40 can be fixed to the boss 26. The control substrate 40 and the end wall 31 of the cover 30 may not necessarily be parallel to each other. It is only necessary that the control substrate 40 and the end wall 31 should face each other.

The configuration of the speed reduction mechanism 60 is not limited to that according to the above embodiment. The number of the gears that constitute the speed reduction mechanism 60 may be increased from that according to the above embodiment. The speed reduction mechanism 60 may not be provided. The rotor shaft 51 and the manual shaft 113 may be directly connected to each other.

The configuration of the motor 50 is not limited to that according to the above embodiment. For example, the number of the terminal pins 55 may be different from the number according to the above embodiment. It is only necessary that the motor 50 should be configured to generate a rotation force to be transferred to the switching mechanism 110.

The configuration of the connector 15 is not limited to that according to the above embodiment. For example, the number of the terminal pins 15*b* may be different from the number according to the embodiment. It is only necessary that the connector 15 should be configured such that the wire L2 that extends from the shift ECU 104*d* can be connected to the control substrate 40.

The configuration of the switching mechanism 110 is not limited to that according to the above embodiment. For example, the first end portion of the second rod 117 may be connected to the second extension portion 114*d* of the detent plate 114. It is only necessary that the switching mechanism 110 should be configured to switch the shift range in accordance with a rotation force generated by the motor 50 of the actuator unit 10.

The overall configuration of the automatic transmission 102 is not limited to that according to the above embodiment. For example, working oil may be supplied to the oil path 132 by an electric oil pump. The automatic transmission may be constituted as a continuously variable transmission. In this case, the configuration of the switching mechanism may be changed for use in a continuously variable transmission. The thus configured switching mechanism may be driven by an actuator unit.

The overall configuration of the vehicle 100 is not limited to that according to the above embodiment. For example, the vehicle 100 may include a motor generator as a drive source. An automatic transmission may be incorporated in the power transmission system for the vehicle 100.

What is claimed is:

1. An actuator unit coupled to a switching mechanism that switches a shift range of an automatic transmission and configured to drive the switching mechanism, the actuator unit comprising:

a motor configured to generate a drive force for driving the switching mechanism;

a control substrate configured to control the motor;

a connector configured to connect a wire to the control substrate;

a housing that includes an opening;

a cover configured to cover the opening; and a shock absorption material, wherein:

the motor and the control substrate are positioned in a housing space defined by the housing and the cover;

the control substrate is fixed to the housing;

the shock absorption material is positioned between the control substrate and the cover, and contacts both the control substrate and the cover;

the control substrate includes a first fixing portion fixed to the housing, a second fixing portion fixed to the motor, and a third fixing portion fixed to the connector;

the control substrate has a flat plate shape; and the shock absorption material is positioned at a position overlapping at least one of the first fixing portion, the second fixing portion, and the third fixing portion as viewed in plan in a direction that is orthogonal to a main surface of the control substrate.

2. The actuator unit according to claim 1, wherein:

a protrusion that projects from the control substrate toward the shock absorption material is provided between the control substrate and the cover;

the shock absorption material includes a hole dented inward of the shock absorption material from an outer face that faces the control substrate; and at least a part of the protrusion is positioned inside the hole.

3. The actuator unit according to claim 1, wherein:

when a wall of the cover, the wall contacting the shock absorption material, is defined as a first wall, the first wall has a flat plate shape; and the shock absorption material is positioned at a position overlapping a geometric center of the first wall as viewed in plan in a direction that is orthogonal to a main surface of the first wall.

4. The actuator unit according to claim 1, wherein:

a plurality of the shock absorption materials is provided between the control substrate and the cover;

the control substrate has a flat plate shape; and the shock absorption materials are positioned at positions not overlapping each other as viewed in plan in a direction that is orthogonal to a main surface of the control substrate.

5. The actuator unit according to claim 1, wherein a material of the shock absorption material is gel.

6. The actuator unit according to claim 5, wherein the material of the shock absorption material is the gel and a material that is usable to generate a node of vibration in an end wall of the cover.

7. The actuator unit according to claim 1, wherein the cover is a magnetic body.

* * * * *